United States Patent
Chiu

(10) Patent No.: US 10,387,076 B2
(45) Date of Patent: Aug. 20, 2019

(54) METHODS FOR SCHEDULING DATA-PROGRAMMING TASKS AND APPARATUSES USING THE SAME

(71) Applicant: Silicon Motion, Inc., Jhubei (TW)

(72) Inventor: Shen-Ting Chiu, Houlong Township (TW)

(73) Assignee: Silicon Motion, Inc., Jhubei (TW)

( * ) Notice: Subject to any disclaimer, the term of this patent is extended or adjusted under 35 U.S.C. 154(b) by 207 days.

(21) Appl. No.: 15/403,976

(22) Filed: Jan. 11, 2017

(65) Prior Publication Data

US 2017/0220297 A1    Aug. 3, 2017

(30) Foreign Application Priority Data

Feb. 2, 2016  (TW) .............................. 105103237 A

(51) Int. Cl.
  *G06F 3/06* (2006.01)
  *G06F 12/02* (2006.01)
  *G11C 16/10* (2006.01)

(52) U.S. Cl.
  CPC ............ *G06F 3/0659* (2013.01); *G06F 3/061* (2013.01); *G06F 3/0656* (2013.01); *G06F 3/0679* (2013.01); *G11C 16/10* (2013.01); *G11C 16/102* (2013.01); *G06F 12/0246* (2013.01)

(58) Field of Classification Search
  None
  See application file for complete search history.

(56) References Cited

U.S. PATENT DOCUMENTS

| | | | | |
|---|---|---|---|---|
| 2003/0041086 A1* | 2/2003 | Lankreijer | .............. | G06F 8/458 718/102 |
| 2005/0010717 A1* | 1/2005 | Ng | ........................ | G11C 16/102 711/103 |
| 2007/0035632 A1* | 2/2007 | Silvernail | .............. | G07C 5/085 348/211.3 |
| 2010/0125695 A1* | 5/2010 | Wu | ........................ | G06F 3/0613 711/103 |
| 2014/0215129 A1* | 7/2014 | Kuzmin | .............. | G06F 12/0246 711/103 |
| 2015/0113224 A1* | 4/2015 | Achilles | .............. | G06F 12/0891 711/135 |
| 2016/0378385 A1* | 12/2016 | Kawakami | ............ | G06F 3/0625 711/114 |

FOREIGN PATENT DOCUMENTS

| | | |
|---|---|---|
| TW | 201508756 A | 3/2015 |
| TW | 201508757 A | 3/2015 |
| TW | 201508774 A | 3/2015 |
| TW | I515749 B | 1/2016 |

OTHER PUBLICATIONS

Office Action of corresponding TW application, published on Apr. 20, 2017.

* cited by examiner

*Primary Examiner* — Reginald G Bragdon
*Assistant Examiner* — Paul M Knight
(74) *Attorney, Agent, or Firm* — Wang Law Firm, Inc.

(57) ABSTRACT

The invention introduces a method for scheduling data-programming tasks, performed by a processing unit, including at least the following steps. At least one task of an (i+1)-th batch is performed between directing an engine to perform a task of an i-th batch and reception of an outcome of the task of the i-th batch.

18 Claims, 6 Drawing Sheets

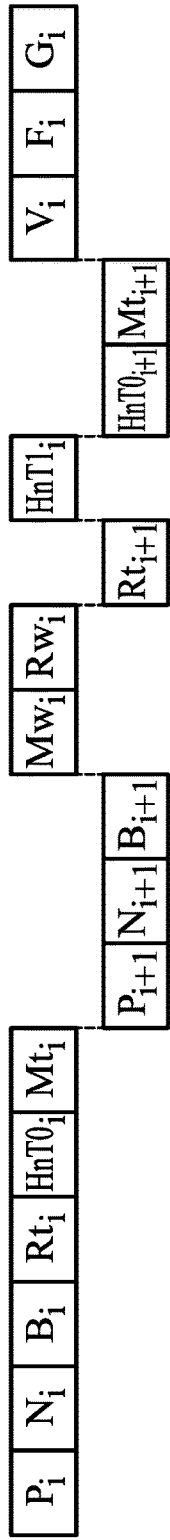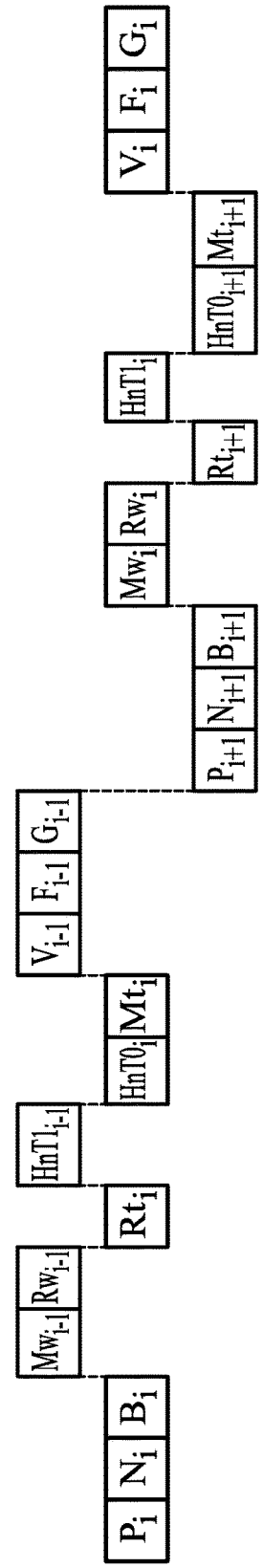
FIG. 6
FIG. 7

METHODS FOR SCHEDULING DATA-PROGRAMMING TASKS AND APPARATUSES USING THE SAME

CROSS REFERENCE TO RELATED APPLICATIONS

This Application claims priority of Taiwan Patent Application No. 105103237, filed on Feb. 2, 2016, the entirety of which is incorporated by reference herein.

BACKGROUND

Technical Field

The present invention relates to flash memory, and in particular to methods for scheduling data-programming tasks and apparatuses using the same.

Description of the Related Art

Flash memory devices typically include NOR flash devices and NAND flash devices. NOR flash devices are random access—a host accessing a NOR flash device can provide the device any address on its address pins and immediately retrieve data stored in that address on the device's data pins. NAND flash devices, on the other hand, are not random access but serial access. It is not possible for NOR to access any random address in the way described above. Instead, the host has to write into the device a sequence of bytes which identifies both the type of command requested (e.g. read, write, erase, etc.) and the address to be used for that command. The address identifies a page (the smallest chunk of flash memory that can be written in a single operation) or a block (the smallest chunk of flash memory that can be erased in a single operation), and not a single byte or word. In reality, the NAND flash device always reads complete pages from the memory cells and writes complete pages to the memory cells. However, a processing unit typically uses a lot of time just waiting for the execution outcomes performed by the other components during data programming. Accordingly, what is needed are methods for scheduling data-programming tasks and apparatuses using the same, thereby enabling the processing unit to reduce the wait time.

BRIEF SUMMARY

An embodiment of the invention introduces a method for scheduling data-programming tasks, performed by a processing unit, including at least the following steps. At least one task of an (i+1)-th batch is performed between directing an engine to perform a task of an i-th batch and reception of the outcome of the task of the i-th batch.

An embodiment of the invention introduces an apparatus for scheduling data-programming tasks including at least an engine and a processing unit. The processing unit, coupled to the engine, performs at least one task of an (i+1)-th batch between directing the engine to perform a task of an i-th batch and reception of the outcome of the task of the i-th batch.

A detailed description is given in the following embodiments with reference to the accompanying drawings.

BRIEF DESCRIPTION OF THE DRAWINGS

The present invention can be fully understood by reading the subsequent detailed description and examples with references made to the accompanying drawings, wherein:

FIG. 6 is a schematic diagram for scheduling data-programming tasks according to an embodiment of the invention.

FIG. 7 is a schematic diagram for scheduling data-programming tasks according to an embodiment of the invention.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figure 1:
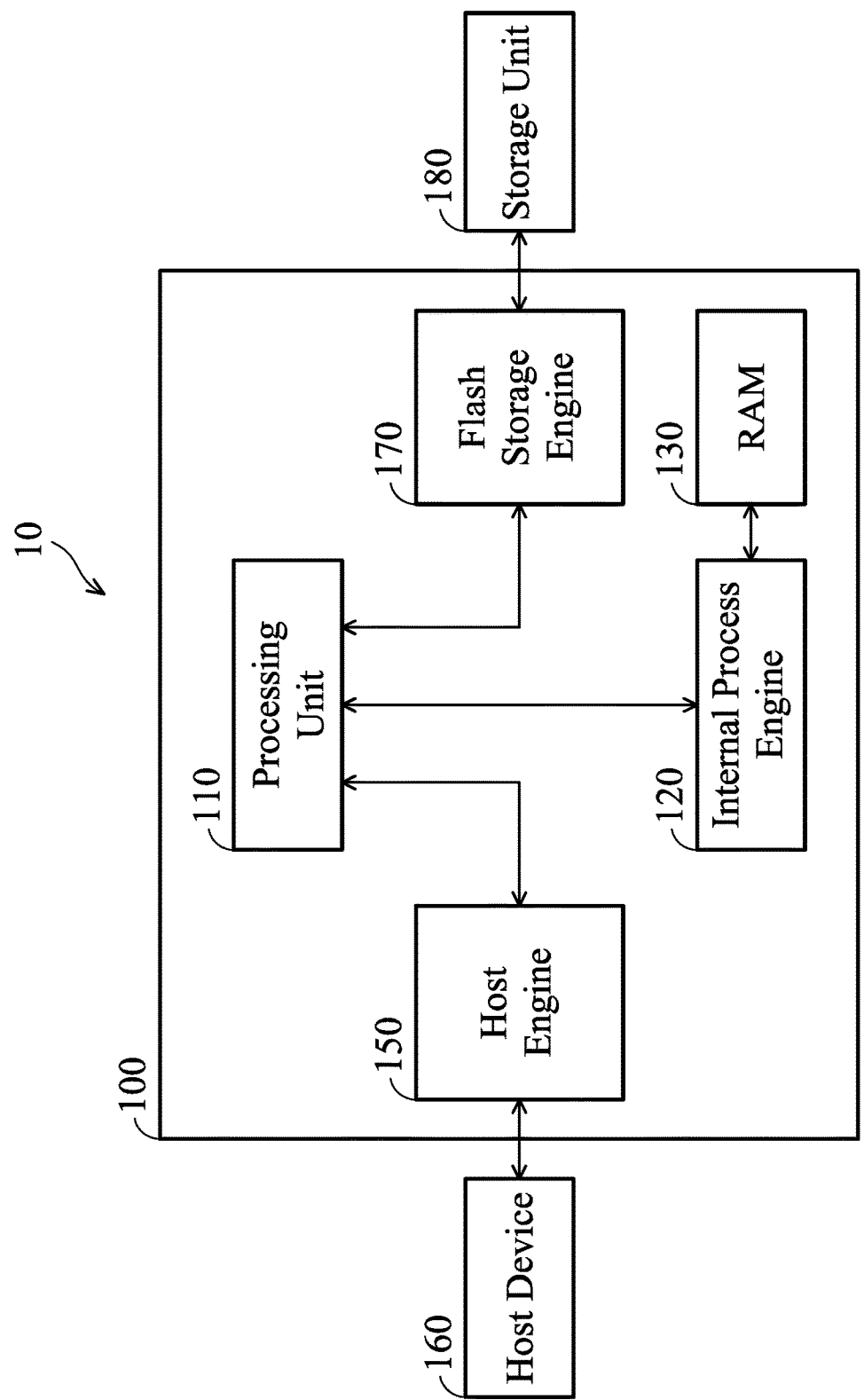
FIG. 1 is the system architecture of a flash memory according to an embodiment of the invention.

FIG. 1 is the system architecture of a flash memory according to an embodiment of the invention. The system architecture 10 of the flash memory contains a processing unit 110 being configured to write data into a designated address of a storage unit 180, and read data from a designated address thereof. Specifically, the processing unit 110 writes data into a designated address of the storage unit 10 through a flash storage engine 170 and reads data from a designated address thereof through the flash storage engine 170. The system architecture 10 uses several electrical signals for coordinating commands and data transfer between the processing unit 110 and the storage unit 180, including data lines, a clock signal and control lines. The data lines are employed to transfer commands, addresses and data to be written and read. The control lines are utilized to issue control signals, such as CE (Chip Enable), ALE (Address Latch Enable), CLE (Command Latch Enable), WE (Write Enable), etc. The flash storage engine 170 may communicate with the storage unit 180 using a DDR (Double Data Rate) protocol, such as ONFI (open NAND flash interface), DDR toggle, or others. The processing unit 110 may ask the storage unit 180 whether there is an existing physical block available to program data into a specified address and activate GC (Garbage Collection) through the flash storage engine 170. The processing unit 110 may communicate with other electronic devices through a host engine 150 using a standard protocol, such as USB (Universal Serial Bus), ATA (Advanced Technology Attachment), SATA (Serial ATA), PCI-E (Peripheral Component Interconnect Express) or others. The processing unit 110 may ask the host device 160 whether any write command is waiting to be processed and receive data from the host device 160 through the host engine 150.

Figure 2:
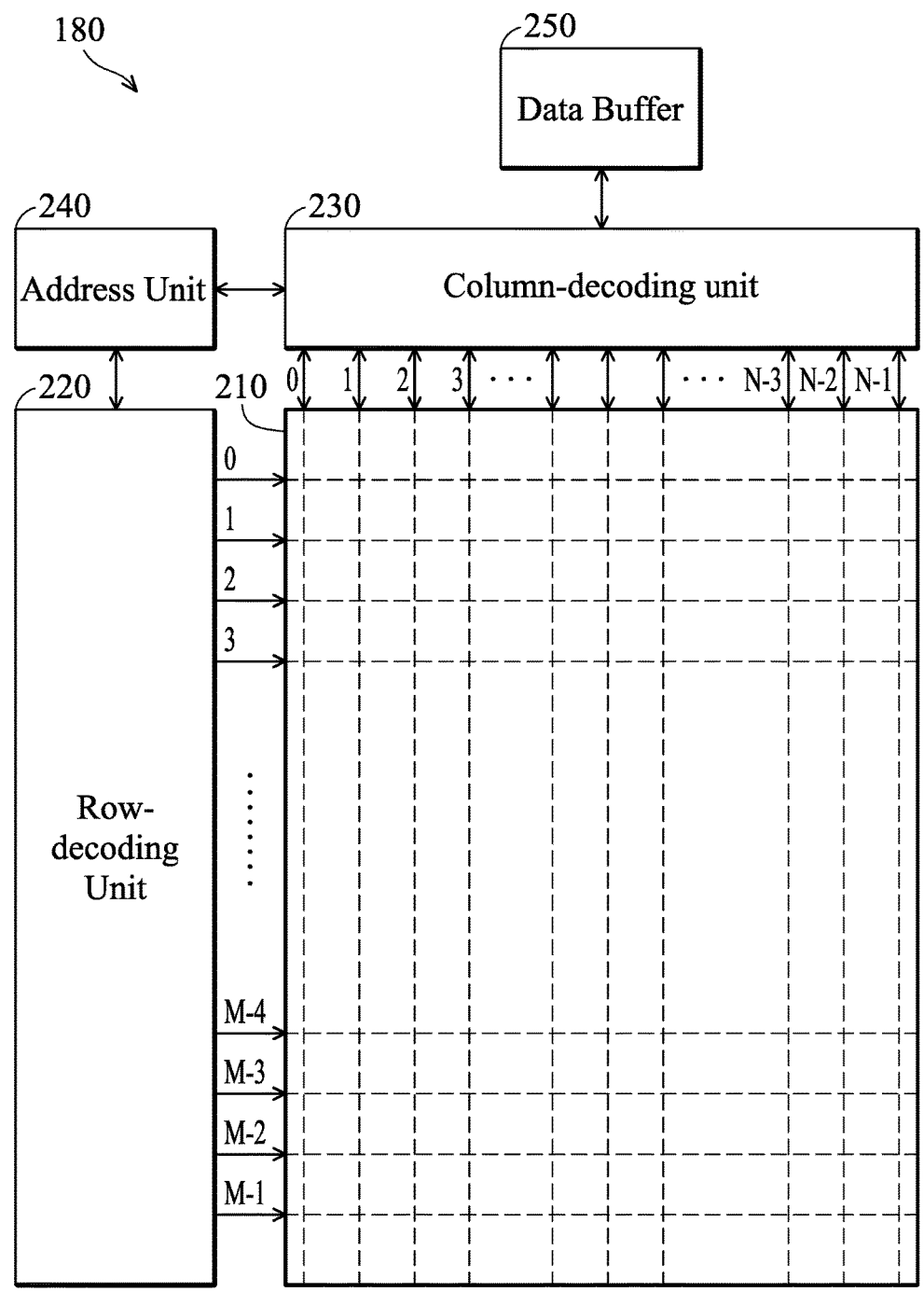
FIG. 2 shows a schematic diagram depicting a storage unit of a flash memory according to an embodiment of the invention.

FIG. 2 shows a schematic diagram depicting a storage unit of a flash memory according to an embodiment of the invention. The storage unit 180 includes an array 210 composed of M×N memory cells, and each memory cell may store at least one bit of information. The flash memory may be a NAND flash memory, etc. In order to appropriately access the desired information, a row-decoding unit 220 is used to select appropriate row lines for access. Similarly, a column-decoding unit 230 is employed to select an appropriate number of bytes within the row for output. An address unit 240 applies row information to the row-decoding unit 220 defining which of the N rows of the memory cell array 210 is to be selected for reading or writing. Similarly, the column-decoding unit 230 receives address information defining which one or ones of the M columns of the memory cell array 210 are to be selected. Rows may be referred to as wordlines by those skilled in the art, and columns may be referred to as bitlines. Data read from or to be applied to the memory cell array 210 is stored in a data buffer 250. Memory cells may be SLCs (Single-Level Cells), MLCs (Multi-Level Cells) or TLCs (Triple-Level Cells).

Figure 3:
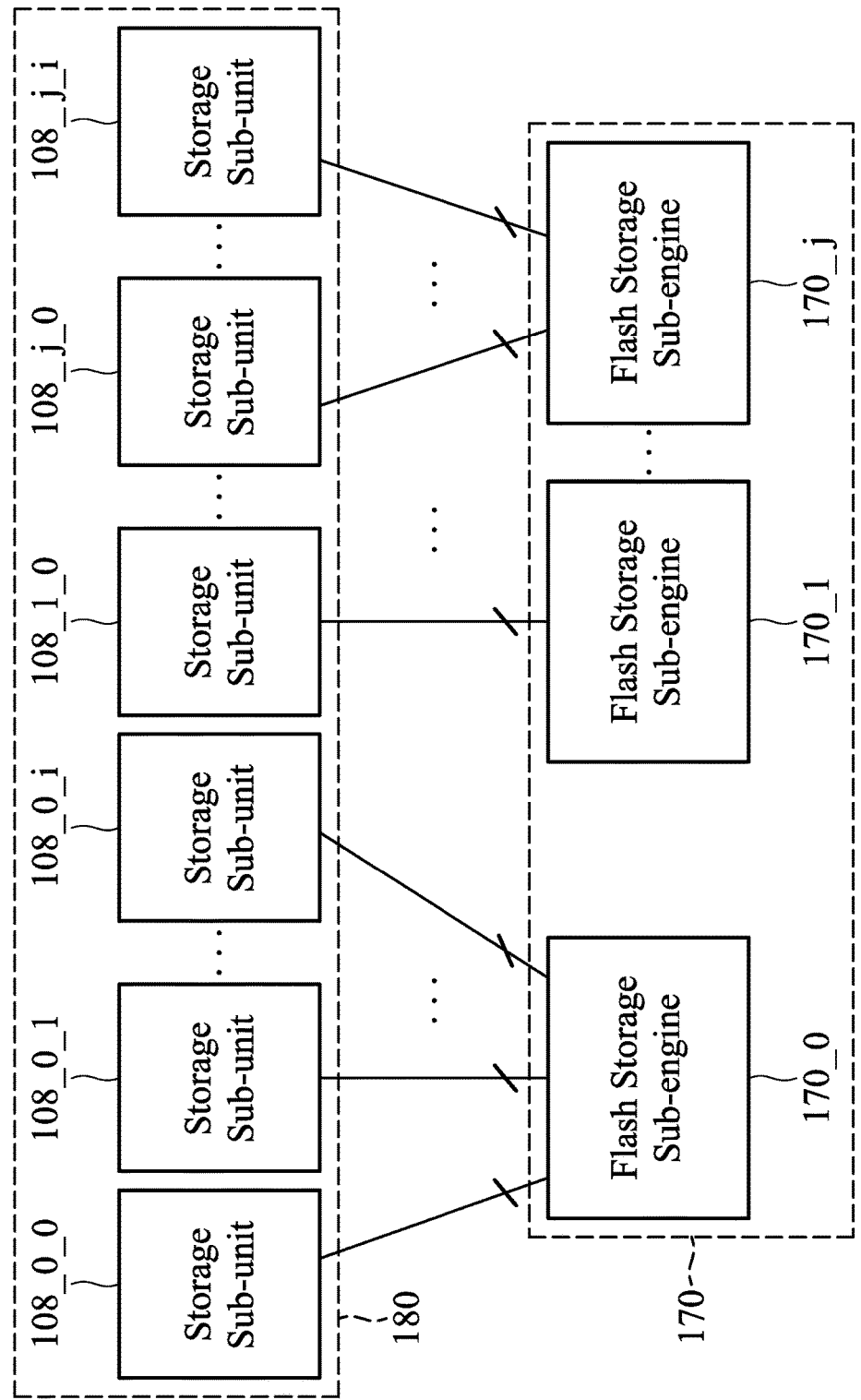
FIG. 3 is a schematic diagram illustrating interfaces to storage units of a flash storage according to an embodiment of the invention.
Figure 4:
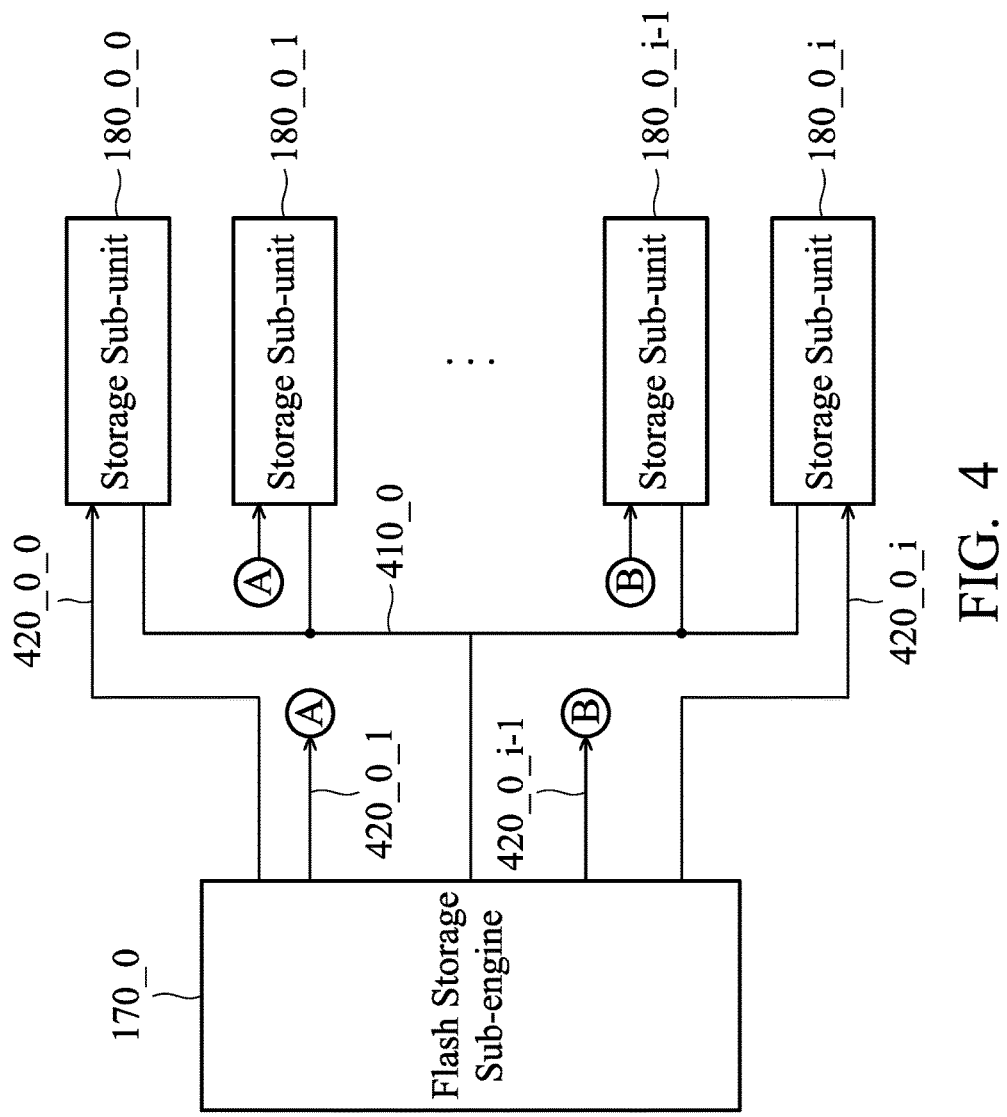
FIG. 4 is a schematic diagram depicting connections between one flash storage sub-engine and multiple storage sub-units according to an embodiment of the invention.

The storage unit 180 may contain multiple storage sub-units and each storage sub-unit may be practiced in a single die and use a flash storage sub-engine to communicate with the processing unit 110. FIG. 3 is a schematic diagram illustrating interfaces to storage units of a flash storage according to an embodiment of the invention. The flash memory 10 may contain j+1 flash storage sub-engines 170_0 to 170_j, where the flash storage sub-engines may be referred to as channels, and each flash storage sub-engine connects to i+1 storage sub-units. That is, i+1 storage sub-units may share the same flash storage sub-engine. For example, assume that the flash memory contains 4 channels (j=3) and each channel connects to 4 storage sub-units (i=3): The flash memory 10 has 16 storage sub-units 180_0_0 to 180_j_i in total. The control unit 110 may direct one of the flash storage sub-engines 170_0 to 170_j to read data from the designated storage sub-unit. Each storage sub-unit has an independent CE control signal. That is, it is required to enable a corresponding CE control signal when attempting to perform a data-write into a designated storage sub-unit via an associated flash storage sub-engine. It is apparent that any number of channels may be provided in the flash memory 10, and each channel may be associated with any number of storage sub-units, and the invention should not be limited thereto. FIG. 4 is a schematic diagram depicting connections between one flash storage sub-engine and multiple storage sub-units according to an embodiment of the invention. The processing unit 110, through the flash storage sub-engine 170_0, may use independent CE control signals 420_0_0 to 420_0_i to select one of the connected storage sub-units 180_0_0 to 180_0_i, and then read data from the designated location of the selected storage sub-unit via the shared data line 410_0.

A master device 160 may provide an LBA (Logical Block Address) to the processing unit 110 through the host engine 150 to indicate a particular region for data to be read from or written into. In order to optimize the data write efficiency, an internal process engine 120 distributes data with continuous LBAs across different physical regions of different storage sub-units. Thus, a mapping table, also referred to as an H2F (Host-to-Flash) table, is stored to indicate which location of a storage sub-unit data of each LBA is physically stored in. A DRAM may allocate space to store the mapping table. The processing unit 110 may ask the RAM 130 whether it has enough space to buffer data to be programmed and read, and to update information of the mapping table, and calculate physical addresses of the storage unit 180 (such as block numbers, page number, etc.) through the internal process engine 120. The processing unit 110, the internal process engine 120, the RAM 130, the host engine 150, and the flash storage engine 170 may be collectively referred to as a flash controller 100.

Figure 5:
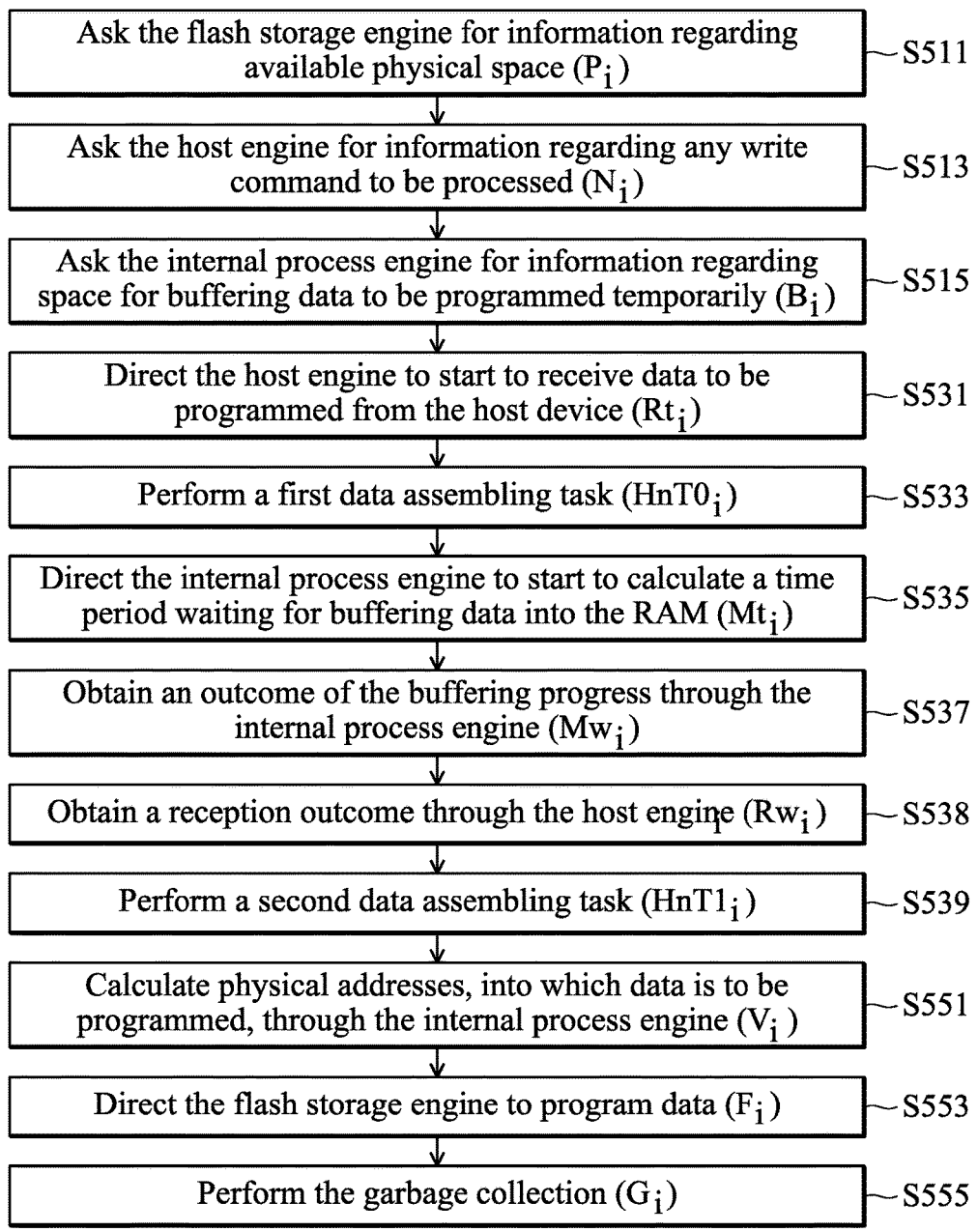
FIG. 5 is a flowchart illustrating a method for programming data according to an embodiment of the invention.

Assume that k storage sub-units share one channel and the minimum unit for programming data into one storage sub-unit is l pages: In order to make the programming operation more efficient, in each batch, the flash controller 100 may collect and program k*l pages of data into the storage unit 180. In some embodiments, the processing unit 110 may perform a series of tasks to coordinate with the internal process engine 120, the host engine 150 and the flash storage engine 170 to program k*l pages of data. FIG. 5 is a flowchart illustrating a method for programming data according to an embodiment of the invention. For the i-th batch of data, the processing unit 110 asks the flash storage engine 170 whether the storage unit 180 has enough physical space available for the data to be programmed, denoted as "$P_i$" (step S511), asks the host engine 150 whether any write command is waiting to be processed, denoted as "$N_i$" (step S513), and asks the internal process engine 120 whether the RAM 130 has enough space to buffer data to be programmed temporarily, denoted as "$B_i$" (step S515). Next, the processing unit 110 directs the host engine 150 to start to receive data to be programmed from the host device 160, denoted as "$Rt_i$" (step S531), and after a time period, such as 100 µs, obtains a reception outcome through the host engine 150, denoted as "$Rw_i$", that is, a completion of receiving the i-th batch of data to be programmed (step S538). Between $Rt_i$ and $Rw_i$, the processing unit 110 performs a first data assembling task for joining the (i−1)-th batch of data (its length is shorter than k*l pages), which has been programmed, with the received data so far to be programmed, denoted as "$HnT0_i$" (step S533), directs the internal process engine 120 to start to calculate a time period for waiting for data to buffer into the RAM 130, denoted as "$Mt_i$" (step S535), and after the time period, such as 50 µs, obtains an outcome of the buffering progress through the internal process engine 120, denoted as "$Mw_i$" (step S537). It should be noted that the first data assembling task can be omitted when k*l pages of data have been completely received from the host device 160 in the (i−1)-th batch. After $Rw_i$, the processing unit 110 performs a second data assembling task for joining the (i−1)-th batch of data (its length is shorter than k*l pages), which has been programmed, with the received data so far to be programmed, denoted as "$HnT1_i$" (step S539). It should be noted that the second data assembling task can be omitted when k*l pages of data have been completely received from the host device 160 in the (i−1)-th batch and the first data assembling task. Subsequently, the processing unit 110 calculates physical addresses, into which data is to be programmed, through the internal process engine 120, denoted as "$V_i$" (step S551), directs the flash storage engine 170 to program data, denoted as "$F_i$" (step S553), and, if required, performs the GC, denoted as "$G_i$" (step S555). However, in the aforementioned process, the processing unit 110 has to wait between some steps, resulting in computation resources being idle. For example, the processing unit 110, between steps S531 and S538, waits until the host engine 150 completely receives data to be programmed. Or, the processing unit 110, between steps S535 and S537, waits for a confirmation outcome from the internal process engine 120.

To avoid computation resources being idle, the processing unit 110 may insert a portion of the tasks of the (i+1)-th batch into the data-programming operation of the i-th batch to reduce idle time of the processing unit 110. Specifically, the processing unit 110 may insert a portion of tasks of the (i+1)-th batch into the time period between directing an engine (such as the host engine 150, the flash storage engine 170, the internal process engine 120, etc.) to perform a task of the i-th batch and reception of the outcome of the task of the i-th batch. FIG. 6 is a schematic diagram for scheduling data-programming tasks according to an embodiment of the invention. Although the lengths of the tasks as shown in FIG. 6 are the same, it does not mean that the processing unit 110 takes the same amount of time to perform each of the tasks, and the invention should not be limited thereto. The processing unit 110, between the tasks $Mt_i$ and $Mw_i$ of the i-th batch, that is, before reception of an outcome from the internal process engine 120, performs the tasks $P_{i+1}$, $N_{i+1}$ and $B_{i+1}$ of the (i+1)-th batch. In addition, the processing unit 110 may, between the tasks $Rw_i$ and $HnT1_i$ of the i-th batch, perform the task $Rt_{i+1}$ of the (i+1)-th batch, and, between the tasks $HnT1_i$ and $V_i$ of the i-th batch, perform the tasks $HnT0_{i+1}$ and $Mt_{i+1}$ of the (i+1)-th batch. In other words, between directing the internal process engine 120 to start to calculate a time period for waiting for data of the i-th batch to buffer into the RAM 130 (Mt) and reception of an outcome of a buffering progress of the i-th batch from the internal process engine 120 ($Mw_i$), asking the flash storage engine 170 whether the storage unit 180 has enough physical space available for data of the (i+1)-th batch to be programmed ($P_{i+1}$), asking the host engine 150 whether any write command of the (i+1)-th batch is waiting to be processed ($N_{i+1}$), and asking the internal process engine 120 whether the RAM 130 has enough space to buffer the data of the (i+1)-th batch to be programmed ($B_{i+1}$). After completely receiving the data of the i-th batch through the host engine 150 ($Rw_i$), the processing unit 110 directs the host engine 150 to start to receive the data of the (i+1)-th batch ($Rt_{i+1}$) and directs the internal process engine 120 to start to calculate a time period for waiting for the data of the (i+1)-th batch to buffer into the RAM 130 ($Mt_{i+1}$). After completely receiving the data of the i-th batch through the host engine 150 ($Rw_i$), the processing unit 110 performs the second data assembling task of the i-th batch ($HnT1_{i+1}$) and the first data assembling task of the (i+1)-th batch ($HnT0_{i+1}$).

To avoid computation resources being idle, the processing unit 110 may insert a portion of the tasks of the (i−1)-th and (i+1)-th batches into the data-programming operation of the i-th batch to reduce idle time of the processing unit 110. Specifically, the processing unit 110 may insert a portion of tasks of the (i−1)-th and the (i+1)-th batches into a time period between directing an engine (such as the host engine 150, the flash storage engine 170, the internal process engine 120, etc.) to perform a task of the i-th batch and reception of the outcome of the task of the i-th batch. FIG. 7 is a schematic diagram for scheduling data-programming tasks according to an embodiment of the invention. Although the lengths of the tasks as shown in FIG. 7 are the same, it does not mean that the processing unit 110 takes the same amount of time to perform each of the tasks, and the invention should not be limited thereto. The processing unit 110, between the tasks $Mt$ and $Mw_i$ of the i-th batch, that is, before reception of an outcome from the internal process engine 120, performs the tasks $V_{i-1}$, $F_{i-1}$ and of the (i−1)-th batch and the tasks $P_{i+1}$, $N_{i+1}$ and $B_{i+1}$ of the (i+1)-th batch. In addition, the processing unit 110 may, between the tasks $Rw_i$ and $HnT1_i$ of the i-th batch, perform the task $Rt_{i+1}$ of the (i+1)-th batch, and, between the tasks $HnT1_i$ and $V_i$ of the i-th batch, perform the tasks $HnT0_{i+1}$ and $Mt_{i+1}$ of the (i+1)-th batch. In other words, between directing the internal process engine 120 to start to calculate a time period for waiting for data of the i-th batch to buffer into the RAM 130 ($Mt_i$) and reception of an outcome of a buffering progress of the i-th batch from the internal process engine 120 ($Mw_i$), the processing unit 110 calculates physical addresses, into which data of the (i−1)-th batch is to be programmed, through the internal process engine 120 ($V_{i-1}$), and directs the flash storage engine 170 to program the data of the (i−1)-th batch ($F_{i-1}$). Before directing the internal process engine 120 to start to calculate the time period for waiting for the data of the i-th batch to buffer into the RAM 130 (Mt), the processing unit 110 obtains the buffering progress of the data of the (i−1)-th batch, which has been buffered in the RAM 130, through the internal process engine 120 ($Rw_{i-1}$). After completely receiving the data of the i-th batch through the host engine 150 ($Rw_i$), the processing unit 110 directs the host engine 150 to start to receive the data of the (i+1)-th batch ($Rt_{i+1}$) and directs the internal process engine 120 to start to calculate a time period for waiting for the data of the (i+1)-th batch to buffer into the RAM 130 ($Mt_{i+1}$). After completely receiving the data of the i-th batch through the host engine 150 ($Rw_i$), the processing unit 110 performs the second data assembling task of the i-th batch ($HnT1_{i+1}$) and the first data assembling task of the (i+1)-th batch ($HnT0_{i+1}$).

Although the embodiment has been described as having specific elements in FIG. 1, it should be noted that additional elements may be included to achieve better performance without departing from the spirit of the invention. While the process flow described in FIG. 5 and the scheduling process described in FIGS. 6 and 7 include a number of operations or tasks that appear to occur in a specific order, it should be apparent that these processes can include more or fewer operations, which can be executed serially or in parallel (e.g., using parallel processors or a multi-threading environment).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for scheduling data-programming tasks, performed by a processing unit, comprising:
    performing at least one task of an i-th batch for data-programming operation; and
    inserting a portion of tasks of an (i+1)-th batch into the data-programming operation of the i-th batch by performing at least one task of the (i+1)-th batch between directing an engine to perform a task of the i-th batch and reception of an outcome of the task of the i-th batch, wherein in each batch, the processing unit is configured to collect and program k*l pages of data into a plurality of storage sub-units, where k indicates quantity of the storage sub-units sharing one channel and l indicates the minimum pages for programming data into one storage sub-unit, and the processing unit is configured to perform a series of tasks to coordinate with an internal process engine, a host engine and a flash storage engine to program the k*l pages of data, and wherein the step of inserting a portion of tasks of the (i+1)-th batch into the data-programming operation of the i-th batch by performing at least one task of the (i+1)-th batch between directing an engine to perform a task of the i-th batch and reception of an outcome of the task of the i-th batch further comprises:

between directing the internal process engine to start to calculate a time period for waiting for data of the i-th batch to buffer into a random access memory and reception of an outcome of a buffering progress of the i-th batch from the internal process engine, asking the flash storage engine whether a storage unit has enough physical space available for data of the (i+1)-th batch to be programmed while the internal process engine is calculating the time period for waiting for data of the i-th batch to buffer into a random access memory.

2. The method of claim 1, further comprising:

after completely receiving the data of the i-th batch through the host engine, directing the host engine to start to receive the data of the (i+1)-th batch and directing the internal process engine to start to calculate a time period for waiting for the data of the (i+1)-th batch to buffer into the random access memory.

3. The method of claim 1, further comprising:

performing at least one task of an (i-1)-th batch between directing the engine to perform the task of the i-th batch and reception of the outcome of the task of the i-th batch.

4. The method of claim 3, wherein the step of inserting a portion of tasks of the (i+1)-th batch into the data-programming operation of the i-th batch by performing at least one task of the (i+1)-th batch between directing the engine to perform a task of the i-th batch and reception of an outcome of the task of the i-th batch further comprises:

between directing the internal process engine to start to calculate a time period for waiting for data of the i-th batch to buffer into a random access memory and reception of an outcome of a buffering progress of the i-th batch from the internal process engine, asking the flash storage engine whether the storage unit has enough physical space available for data of the (i+1)-th batch to be programmed, asking the host engine whether any write command of the (i+1)-th batch is waiting to be processed, and asking the internal process engine whether the random access memory has enough space to buffer the data of the (i+1)-th batch to be programmed, and wherein the step of performing at least one task of the (i-1)-th batch between directing the engine to perform the task of the i-th batch and reception of the outcome of the task of the i-th batch further comprises:

calculating physical addresses, into which data of the (i-1)-th batch is to be programmed, through the internal process engine, and directing the flash storage engine to program the data of the (i-1)-th batch.

5. The method of claim 4, further comprising:

before directing the internal process engine to start to calculate the time period for waiting for the data of the i-th batch to buffer into the random access memory, obtaining a buffering progress of the data of the (i-1)-th batch, which has been buffered in the random access memory, through the internal process engine, and receiving the data of the i-th batch through the host engine; and after completely receiving the data of the i-th batch through the host engine, directing the host engine to start to receive the data of the (i+1)-th batch and directing the internal process engine to start to calculate a time period for waiting for the data of the (i+1)-th batch to buffer into the random access memory.

6. The method of claim 5, further comprising:

after completely receiving the data of the i-th batch through the host engine, calculating physical addresses, into which the data of the i-th batch is to be programmed, through the internal process engine, and directing the flash storage engine to program the data of the i-th batch.

7. The method of claim 6, further comprising:

after completely receiving the data of the i-th batch through the host engine, performing a second data assembling task of the i-th batch and a first data assembling task of the (i+1)-th batch.

8. The method of claim 1, further comprising:

asking the host engine whether any write command of the (i+1)-th batch is waiting to be processed while the internal process engine is calculating the time period for waiting for data of the i-th batch to buffer into a random access memory.

9. The method of claim 1, further comprising:

asking the internal process engine whether the random access memory has enough space to buffer the data of the (i+1)-th batch to be programmed while the internal process engine is calculating the time period for waiting for data of the i-th batch to buffer into a random access memory.

10. An apparatus for scheduling data-programming tasks, comprising:

an engine; and a processing unit, coupled to the engine, performing at least one task of an i-th batch for data-programming operation and inserting a portion of tasks of an (i+1)-th batch into the data-programming operation of the i-th batch by performing at least one task of the (i+1)-th batch between directing the engine to perform a task of the i-th batch and reception of an outcome of the task of the i-th batch, where in each batch, the processing unit is configured to collect and program k*l pages of data into a plurality of storage sub-units, where k indicates quantity of the storage sub-units sharing one channel and l indicates the minimum pages for programming data into one storage sub-unit, and the processing unit is configured to perform a series of tasks to coordinate with the engine to program the k*l pages of data, wherein the engine comprises an internal process engine, a flash storage engine and a host engine, and the processing unit, between directing the internal process engine to start to calculate a time period for waiting for data of the i-th batch to buffer into a random access memory and reception of an outcome of a buffering progress of the i-th batch from the internal process engine, asks the flash storage engine whether a storage unit has enough physical space available for data of the (i+1)-th batch to be programmed while the internal process engine is calculating the time period for waiting for data of the i-th batch to buffer into a random access memory.

11. The apparatus of claim 10, wherein the processing unit, after completely receiving the data of the i-th batch through the host engine, directs the host engine to start to receive the data of the (i+1)-th batch and directs the internal process engine to start to calculate a time period for waiting for the data of the (i+1)-th batch to buffer into the random access memory.

12. The apparatus of claim 10, wherein the processing unit performs at least one task of an (i−1)-th batch between directing the engine to perform the task of the i-th batch and reception of the outcome of the task of the i-th batch.

13. The apparatus of claim 12, wherein the processing unit, between directing the internal process engine to start to calculate a time period for waiting for data of the i-th batch to buffer into a random access memory and reception of an outcome of a buffering progress of the i-th batch from the internal process engine, asks the flash storage engine whether the storage unit has enough physical space available for data of the (i+1)-th batch to be programmed, asks the host engine whether any write command of the (i+1)-th batch is waiting to be processed, asks the internal process engine whether the random access memory has enough space to buffer the data of the (i+1)-th batch to be programmed, calculates physical addresses, into which data of the (i−1)-th batch is to be programmed, through the internal process engine, and directs the flash storage engine to program the data of the (i−1)-th batch.

14. The apparatus of claim 13, wherein the processing unit, before directing the internal process engine to start to calculate the time period for waiting for the data of the i-th batch to buffer into the random access memory, obtains a buffering progress of the data of the (i−1)-th batch, which has been buffered in the random access memory, through the internal process engine, and receives the data of the i-th batch through the host engine, and, after completely receiving the data of the i-th batch through the host engine, directing the host engine to start to receive the data of the (i+1)-th batch and directing the internal process engine to start to calculate a time period for waiting for the data of the (i+1)-th batch to buffer into the random access memory.

15. The apparatus of claim 14, wherein the processing unit, after completely receiving the data of the i-th batch through the host engine, calculates physical addresses, into which the data of the i-th batch is to be programmed, through the internal process engine, and directs the flash storage engine to program the data of the i-th batch.

16. The apparatus of claim 15, wherein the processing unit, after completely receiving the data of the i-th batch through the host engine, performs a second data assembling task of the i-th batch and a first data assembling task of the (i+1)-th batch.

17. The apparatus of claim 10, wherein the processing unit asks the host engine whether any write command of the (i+1)-th batch is waiting to be processed while the internal process engine is calculating the time period for waiting for data of the i-th batch to buffer into a random access memory.

18. The apparatus of claim 10, wherein the processing unit asks the internal process engine whether the random access memory has enough space to buffer the data of the (i+1)-th batch to be programmed while the internal process engine is calculating the time period for waiting for data of the i-th batch to buffer into a random access memory.

* * * * *